United States Patent
Conner et al.

(10) Patent No.: US 10,090,453 B2
(45) Date of Patent: Oct. 2, 2018

(54) PIEZOELECTRIC JETTING SYSTEM AND METHOD

(71) Applicant: NORDSON CORPORATION, Westlake, OH (US)

(72) Inventors: Scott A. Conner, Foxboro, MA (US); John D. Jones, Cranston, RI (US); Bryan Teece, Fall River, MA (US); Wilson A. Villegas, Warwick, RI (US)

(73) Assignee: Nordson Corporation, Westlake, OH (US)

(*) Notice: Subject to any disclaimer, the term of this patent is extended or adjusted under 35 U.S.C. 154(b) by 111 days.

(21) Appl. No.: 15/154,021

(22) Filed: May 13, 2016

(65) Prior Publication Data

US 2016/0339467 A1    Nov. 24, 2016

Related U.S. Application Data

(60) Provisional application No. 62/165,242, filed on May 22, 2015.

(51) Int. Cl.
*H01L 41/04* (2006.01)
*B05C 5/02* (2006.01)

(52) U.S. Cl.
CPC .......... *H01L 41/042* (2013.01); *B05C 5/0225* (2013.01)

(58) Field of Classification Search
CPC ..... H01L 41/042; B05C 5/0225; H03K 17/73; H03K 17/16
USPC ..................... 239/4; 327/380–381
See application file for complete search history.

(56) References Cited

U.S. PATENT DOCUMENTS

| | | | | |
|---|---|---|---|---|
| 3,859,584 A * | 1/1975 | Corry | ...................... | H02M 7/49 363/43 |
| 5,094,398 A * | 3/1992 | Jeter | .................. | B05B 13/0278 239/134 |
| 6,152,386 A * | 11/2000 | Bullock | .................. | B05B 1/304 239/135 |
| 7,399,361 B2 * | 7/2008 | de Leeuw | ................. | B05C 5/02 118/300 |
| 9,429,368 B2 * | 8/2016 | Hong | ...................... | F04B 43/04 |
| 9,457,935 B2 | 10/2016 | Fliess et al. | | |

(Continued)

FOREIGN PATENT DOCUMENTS

DE    102012109123 A1    3/2014
DE    102013102693 A1    9/2014

(Continued)

OTHER PUBLICATIONS

European Application No. 16170017.4: European Extended Search Report dated Sep. 28, 2016, 7 pages.

*Primary Examiner* — Chee-Chong Lee
(74) *Attorney, Agent, or Firm* — Baker & Hostetler LLP

(57) ABSTRACT

A system and method for jetting a viscous material includes an electronic controller and a jetting dispenser operatively coupled with the electronic controller. The jetting dispenser includes an outlet orifice and a piezoelectric actuator operatively coupled with a movable shaft. The jetting dispenser is under control of the electronic controller for causing said piezoelectric actuator to move the shaft and jet an amount of the viscous material from the outlet orifice. The electronic controller sends a waveform to the piezoelectric actuator to optimize control of the jetting operation.

8 Claims, 9 Drawing Sheets

(56) References Cited

U.S. PATENT DOCUMENTS

| | | | |
|---|---|---|---|
| 2004/0124251 A1* | 7/2004 | Gressett, Jr. | B05B 7/0861 |
| | | | 239/1 |
| 2009/0101669 A1* | 4/2009 | Hassler, Jr. | B05C 5/001 |
| | | | 222/1 |
| 2015/0073454 A1 | 3/2015 | Uchida et al. | |
| 2016/0004257 A1 | 1/2016 | Fliess et al. | |

FOREIGN PATENT DOCUMENTS

| | | | |
|---|---|---|---|
| GB | 2394915 | 5/2004 | |
| KR | 1020130096739 | * 11/2014 | F04B 17/003 |

* cited by examiner

PIEZOELECTRIC JETTING SYSTEM AND METHOD

CROSS-REFERENCE TO RELATED APPLICATIONS

This application claims priority to provisional U.S. Patent App. No. 62/165,242, filed May 22, 2015, the entire contents of which is incorporated herein by reference.

TECHNICAL FIELD

The present invention generally relates to non-contact, jetting dispensers for depositing small droplets of a viscous fluid onto a substrate, and more specifically, to dispensers of this type that are actuated by one or more piezoelectric elements.

BACKGROUND

Non-contact viscous material dispensers are often used to apply minute amounts of viscous materials, e.g., those with a viscosity exceeding fifty centipoise, onto substrates. For example, non-contact viscous material dispensers are used to apply various viscous materials onto electronic substrates like printed circuit boards. Viscous materials applied to electronic substrates include, by way of example and not by limitation, general purpose adhesives, ultraviolet curable adhesives, solder paste, solder flux, solder mask, thermal grease, lid sealant, oil, encapsulants, potting compounds, epoxies, die attach fluids, silicones, RTV, and cyanoacrylates.

Specific applications abound for dispensing viscous materials from a non-contact jetting dispenser onto a substrate. In semiconductor package assembly, applications exist for underfilling, solder ball reinforcement in ball grid arrays, dam and fill operations, chip encapsulation, underfilling chip scale packages, cavity fill dispensing, die attach dispensing, lid seal dispensing, no flow underfilling, flux jetting, and dispensing thermal compounds, among other uses. For surface-mount technology (SMT) printed circuit board (PCB) production, surface mount adhesives, solder paste, conductive adhesives, and solder mask materials may be dispensed from non-contact dispensers, as well as selective flux jetting. Conformal coatings may also be applied selectively using a non-contact dispenser. Generally, the cured viscous materials protect printed circuit boards and mounted devices thereupon from harm originating from environmental stresses like moisture, fungus, dust, corrosion, and abrasion. The cured viscous materials may also preserve electrical and/or heat conduction properties on specific uncoated areas. Applications also exist in the disk drive industry, in life sciences applications for medical electronics, and in general industrial applications for bonding, sealing, forming gaskets, painting, and lubrication.

Jetting dispensers generally may have pneumatic or electric actuators for moving a shaft or tappet repeatedly toward a seat while jetting a droplet of viscous material from an outlet orifice of the dispenser. The electrically actuated jetting dispensers can, more specifically, use a piezoelectric actuator. When an input voltage is applied to and/or removed from the piezoelectric actuator, the resulting movement of a mechanical armature and the tappet or shaft can include undesirable action, such as oscillation. For example, oscillation can cause fluid to be pumped from the outlet and cause volume inaccuracies in the dispensed amount, or it can generate air bubbles due to cavitation, or it can pull air into the fluid through the outlet.

For at least these reasons, it would be desirable to provide a jetting system and method that address these and other issues, and provide for greater control of jet dispensing operations.

SUMMARY

In an illustrative embodiment the invention provides a system for jetting a fluid including a jetting dispenser and an electronic controller. The jetting dispenser includes a jetting dispenser with a movable shaft, an outlet orifice and a piezoelectric actuator operatively coupled with the movable shaft to jet an amount of the fluid from said outlet orifice. The system further includes an electronic controller operatively coupled to the piezoelectric actuator. The electronic controller applies a voltage with a varying rate of change to the piezoelectric actuator to reduce an oscillation amplitude of the movable shaft during movement toward and/or away from the outlet orifice. The system may include various other features. For example, the controller may send a stepped waveform to the piezoelectric actuator including a first voltage and a second voltage, the second voltage being different than the first voltage. The electronic controller may apply the voltage as a waveform having a decreasing and/or increasing rate of change in the voltage.

The invention also provides a method for jetting a viscous material from a dispenser including a piezoelectric actuator operatively coupled to a movable shaft and a fluid body with an outlet orifice. The method comprises applying a voltage with a varying rate of change to the piezoelectric actuator. The piezoelectric actuator is moved under the applied voltage. The shaft is moved with the piezoelectric actuator. An amount of the viscous material is jetted from said outlet orifice using the moving shaft.

Applying the voltage waveform may further comprise applying a stepped waveform to the piezoelectric actuator including a first voltage and a second voltage, the second voltage being different than the first voltage. Applying the voltage waveform may comprise applying the voltage with a decreasing and/or increasing rate of change.

Various additional features and advantages of the invention will become more apparent to those of ordinary skill in the art upon review of the following detailed description of the illustrative embodiments taken in conjunction with the accompanying drawings.

DETAILED DESCRIPTION

Figure 1:
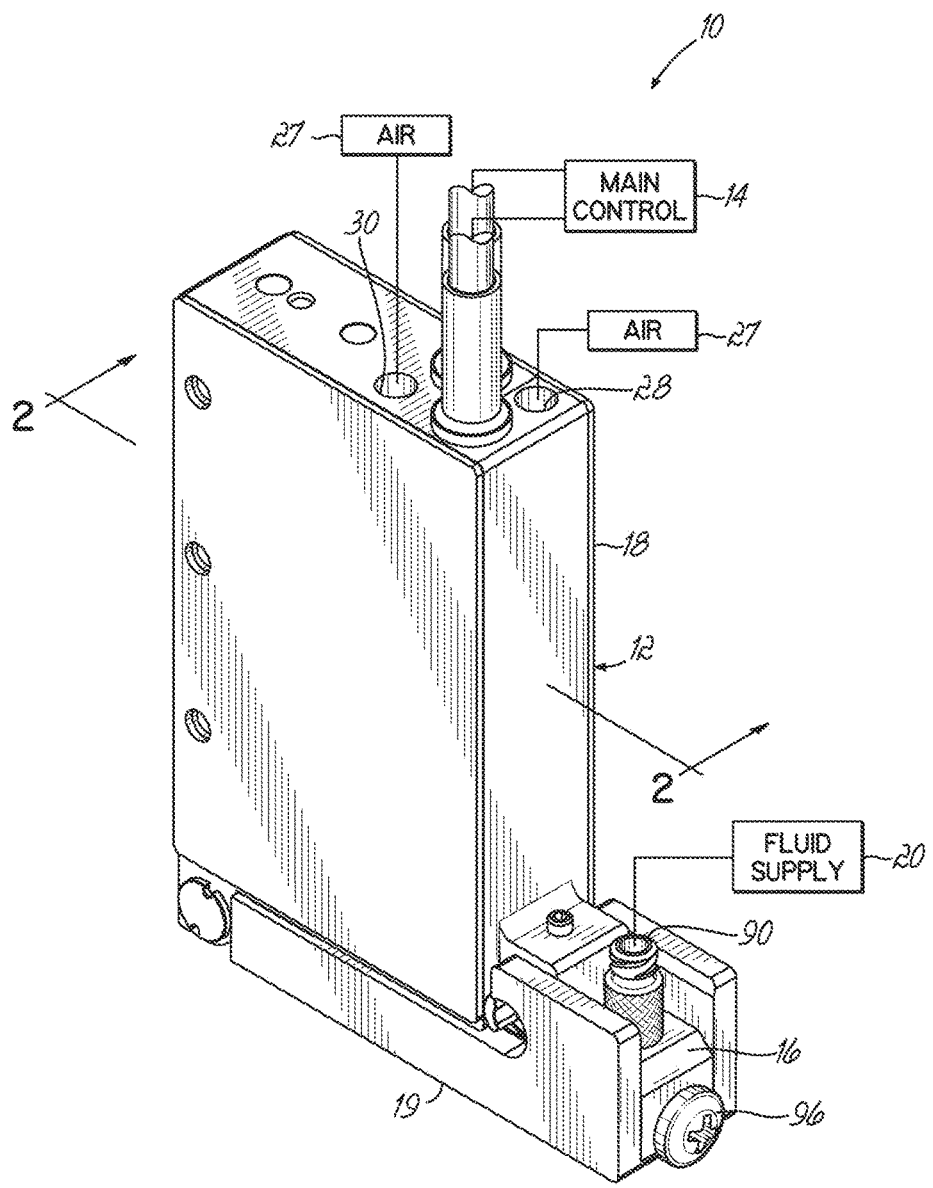
FIG. 1 is a perspective view of a jetting dispenser system according to an illustrative embodiment of the invention.

Referring to FIGS. 1 through 4, a jetting system 10 in accordance with an embodiment of the invention generally comprises a jetting dispenser 12 coupled with a main electronic control 14. The jetting dispenser 12 includes a fluid body 16 coupled to an actuator housing 18. More specifically, the fluid body 16 is held within a fluid body housing 19, which may include one or more heaters (not shown), depending on the needs of the application. The fluid body 16 receives fluid under pressure from a suitable fluid supply 20, such as a syringe barrel (not shown). A tappet or valve assembly 22 is coupled to the housing 18 and extends into the fluid body 16. A mechanical amplifier (e.g., a lever 24) is coupled between a piezoelectric actuator 26 and the tappet or valve assembly 22, as will be described further below.

Figure 2:
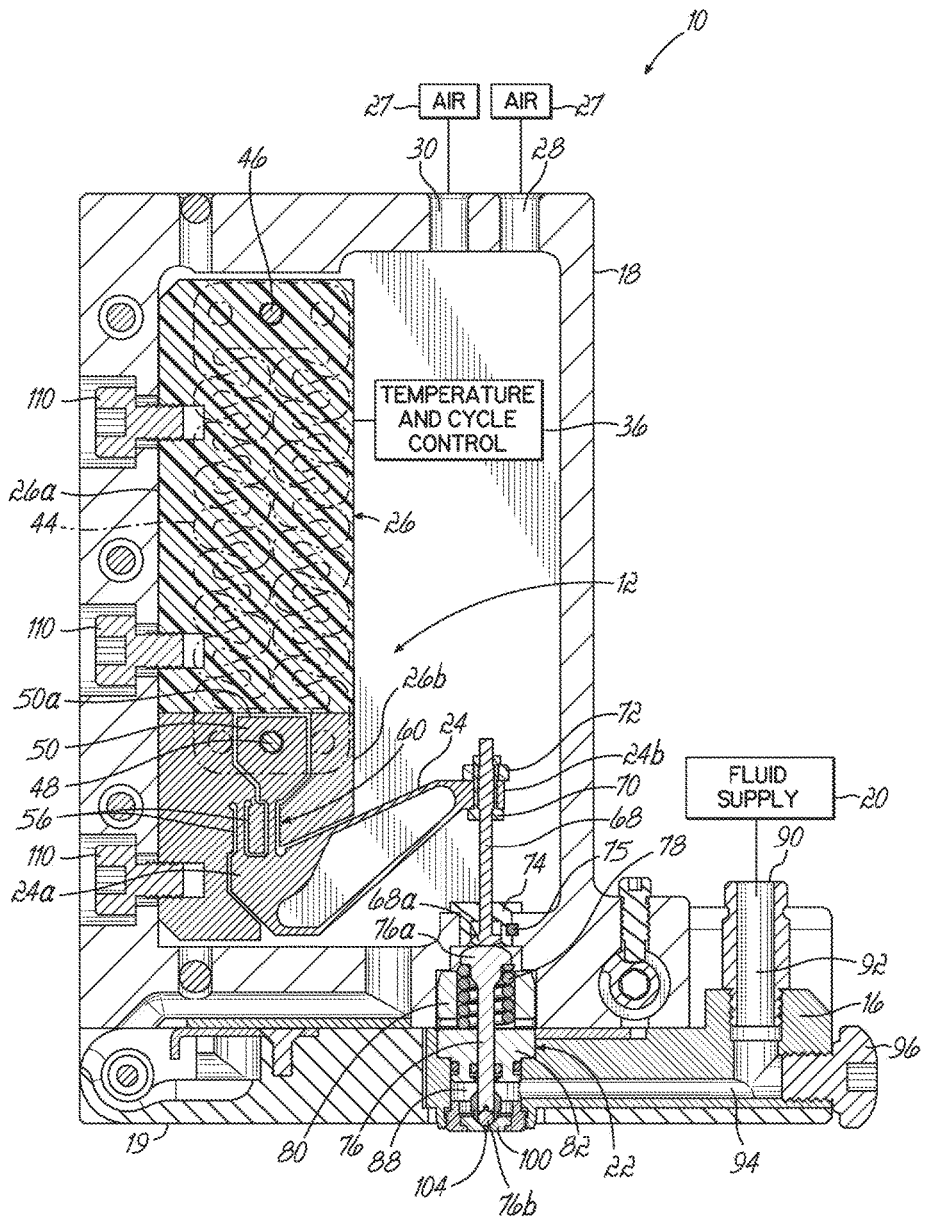
FIG. 2 is a cross sectional view taken along line 2-2 of FIG. 1.

For purposes of cooling the piezoelectric actuator 26, air may be introduced from a source 27 into an inlet port 28 and out from an exhaust port 30. Alternatively, depending on the cooling needs, both of the ports 28, 30 may receive cooling air from the source 27 as shown in FIG. 2. In such a case, one or more other exhaust ports (not shown) would be provided in the housing 18. A temperature and cycle control 36 is provided for cycling the actuator 26 during a jetting operation and for controlling one or more heaters (not shown) carried by the dispenser 12 for maintaining the dispensed fluids to a required temperature. As another option, this control 36, or another control, may control the cooling needs of the actuator 26 in a closed loop manner. As further shown in FIG. 4, the piezoelectric actuator 26 further comprises a stack 40 of piezoelectric elements. This stack 40 is maintained in compression by respective flat, compression spring elements 42, 44 coupled on opposite sides of the stack 40. More specifically, upper and lower pins 46, 48 are provided and hold the flat spring elements 42, 44 to one another with the stack 40 of piezoelectric elements therebetween. The upper pin 46 is held within an upper actuator portion 26a of the actuator 26, while a lower pin 48 directly or indirectly engages a lower end of the stack 40. The upper actuator portion 26a securely contains the stack 40 of piezoelectric elements so that the stack 40 is stabilized against any sideward motion. In this embodiment, the lower pin 48 is coupled to a lower actuator portion 26b and, more specifically, to a mechanical armature 50 (FIG. 2).

An upper surface 50a of the mechanical armature 50 bears against the lower end of the piezoelectric stack 40. The springs 42, 44 are stretched between the pins 46, 48 such that the springs 42, 44 apply constant compression to the stack 40 as shown by the arrows 53 in FIG. 4. The flat springs 42, 44 may, more specifically, be formed from a wire EDM process. The upper end of the piezoelectric element stack 40 is retained against an internal surface of the upper actuator portion 26a. The upper pin 46 is therefore stationary while the lower pin 48 floats or moves with the springs 42, 44 and with the mechanical armature 50, as will be described herein.

When voltage is applied to the piezoelectric stack 40, the stack 40 expands or lengthens and this moves the armature 50 downward against the force of the springs 42, 44. The stack 40 will change length proportional to the amount of applied voltage.

As further shown in FIG. 2, the mechanical armature 50 is operatively coupled to the mechanical amplifier which, in this illustrative embodiment, is formed as the lever 24 coupled to the armature 50 generally near a first end 24a and coupled to a push rod 68 at a second end 24b. The lever 24 may be integrally formed from the lower actuator portion 26b through, for example, an EDM process that also forms a series of slots 56 between the mechanical armature 50 and the lever 24. As will be further discussed below, the lever 24 or other type of mechanical amplifier amplifies the distance that the stack 40 expands or lengthens by a desired amount. For example, in this embodiment, downward movement of the stack 40 and the mechanical armature 50 is amplified by about eight times at the second end 24b of the lever 24.

Now referring more specifically to FIGS. 2, 2A, 2B, and 5, a flexural portion 60 couples the lever 24 to the mechanical armature 50. As shown best in FIG. 5, the lever 24 pivots about a pivot point 62 that is approximately at the same horizontal level as the second end 24b of the lever 24. This position of the pivot point 62 serves to minimize the effect of the arc through which the lever 24 rotates. The series of slots 56 is formed in the lower actuator portion 26b forming the flexural portion 60. When the piezoelectric stack 40 lengthens under the application of a voltage by the main control 14 as shown by the arrow 66 in FIG. 5, the lever 24 rotates clockwise generally about the pivot point 62 as the stack 40 pushes downward on the mechanical armature 50. The slight rotation of the lever 24 takes place against a resilient bias applied by the flexural portion 60. As the second end 24b is rotating slightly clockwise about the pivot point 62, it moves downward and likewise moves an attached push rod 68 downward (FIG. 2) as indicated by the arrow 67 in FIG. 5.

Figure 2A:
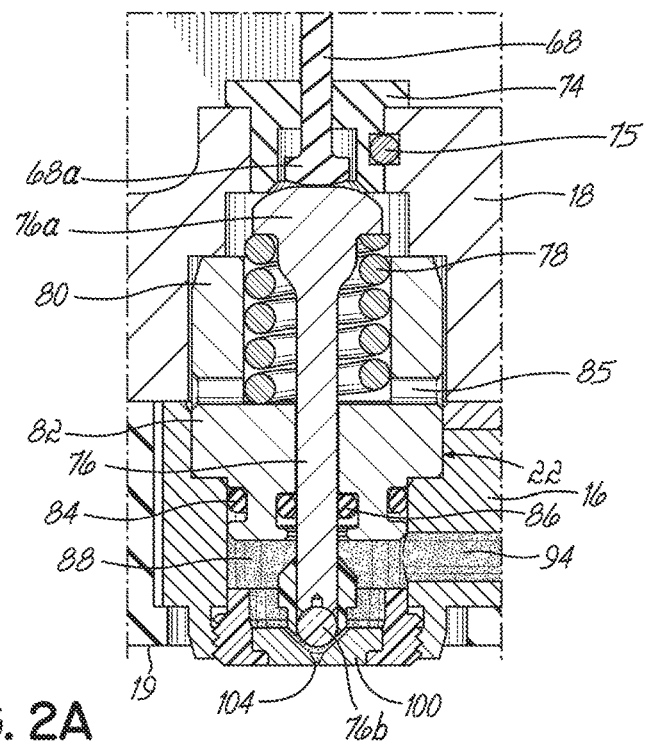
FIG. 2A is an enlarged cross sectional view of the tappet assembly and fluid body taken from FIG. 2, and showing the tappet in an open condition.
Figure 2B:
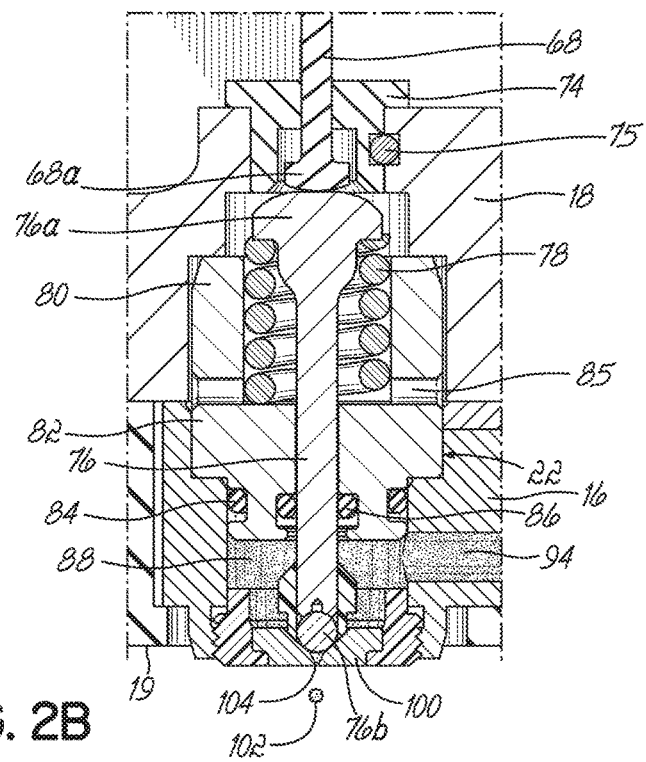
FIG. 2B is a cross sectional view similar to FIG. 2A, but showing the tappet in a closed position after jetting a droplet of fluid.

The second end 24b of the lever 24 is fixed to the push rod 68 using suitable threaded fasteners 70, 72. The push rod 68 has a lower head portion 68a that travels within a guide bushing 74 and bears against an upper head portion 76a of a tappet or valve element 76 associated with the tappet or valve assembly 22. The guide bushing 74 is held in the housing 18 with a pin 75 as best seen in FIGS. 2A and 2B. The assembly of the push rod 68, guide bushing 74, and pin 75 allows for some "give" to ensure proper movement of the push rod 68 during operation. In addition, the push rod 68 is made of a material that will slightly bend sideward, in an elastic manner, during its reciprocating movement with the tappet or valve element 76 and lever 24. The tappet assembly further comprises a coil spring 78 which is mounted within a lower portion of the housing 18 using an annular element 80. The tappet or valve assembly 22 further comprises an insert 82 retained in the fluid body 16 by an O-ring 84. The annular element 80 and the insert 82 comprise an integral element, i.e., a cartridge body in this embodiment. A cross-drilled weep hole 85 is approximately in line with the lower end of the spring 78 to allow any liquid that leaks past the O-ring 86 to escape. An additional O-ring 86 seals the tappet or valve element 76 such that pressurized fluid contained in a fluid bore 88 of the fluid body 16 does not leak out. Fluid is supplied to the fluid bore 88 from the fluid supply 20 through an inlet 90 of the fluid body 16 and passages 92, 94. The O-ring 84 seals the outside of the cartridge body formed by the annular element 80 and insert 82 from the pressurized liquid in bore 88 and passage 94. The fluid passages 92, 94 are sealed by a plug member 96 threaded into the fluid body 16. The plug member 96 may be removed to allow access for cleaning the internal passage 94.

Figure 3:
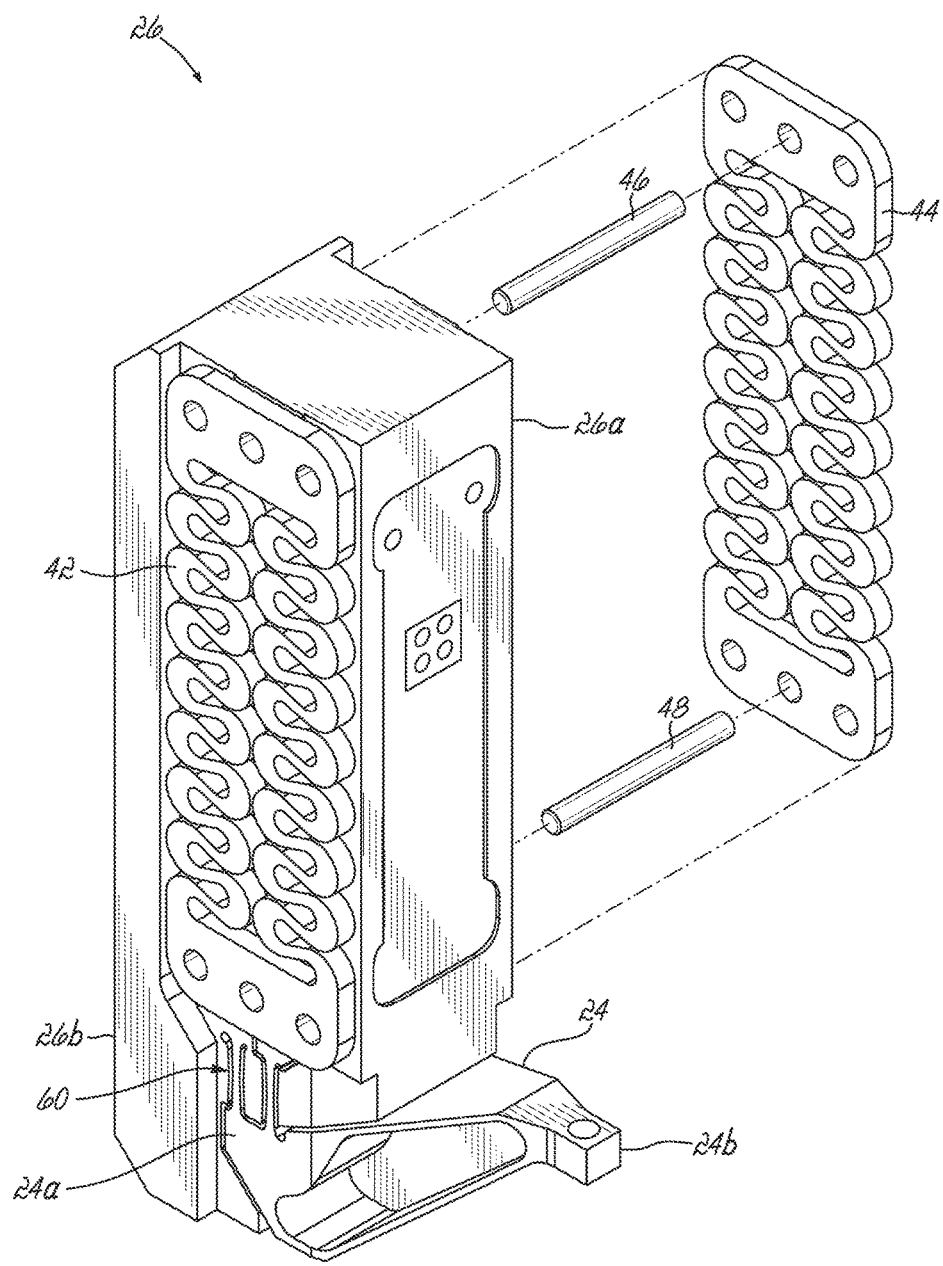
FIG. 3 is a partially exploded perspective view of a piezoelectric actuator of the dispenser.
Figure 4:
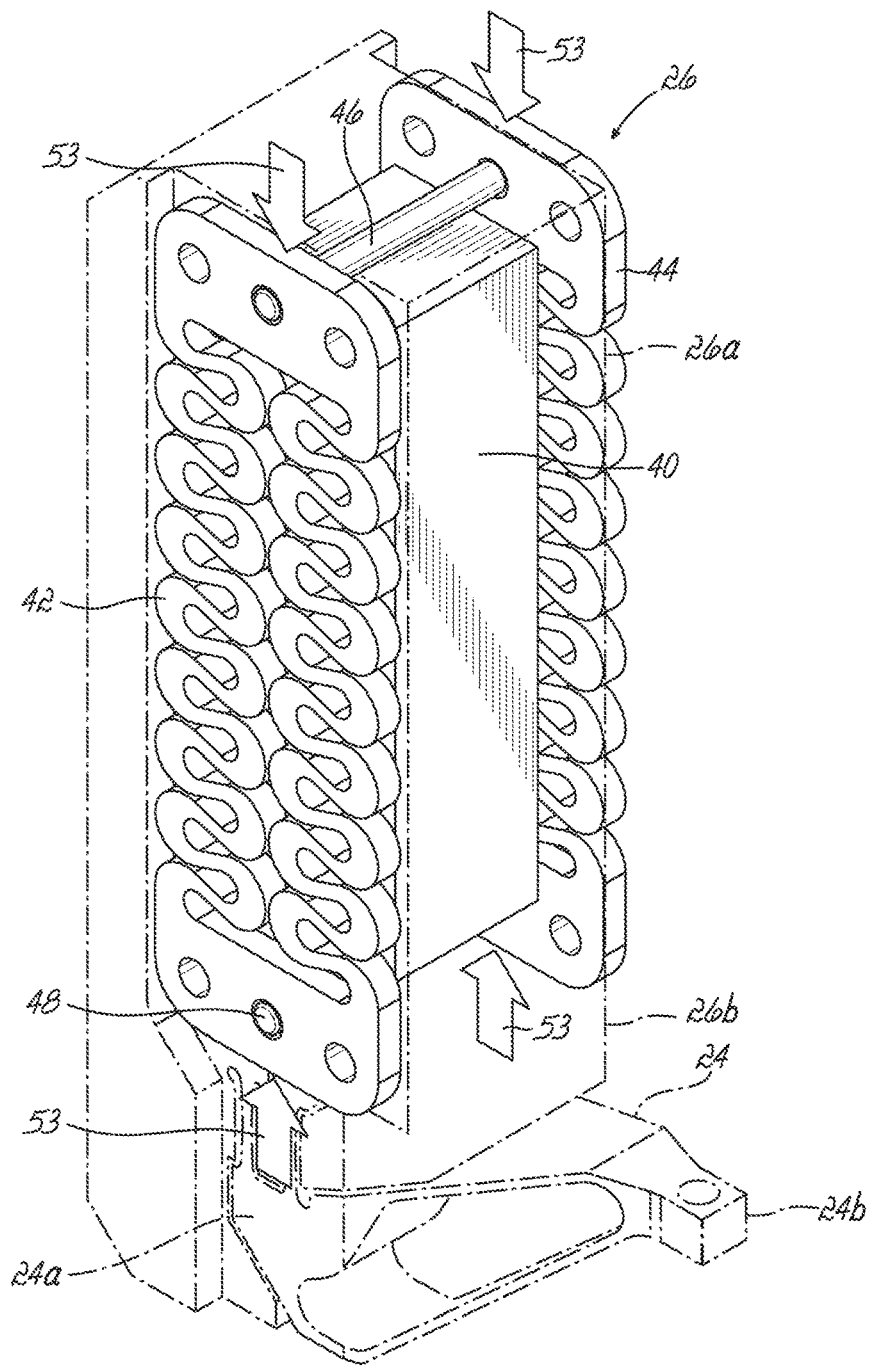
FIG. 4 is a perspective view of the piezoelectric jetting dispenser with certain elements shown in dashed lines to better show inner details.
Figure 5:
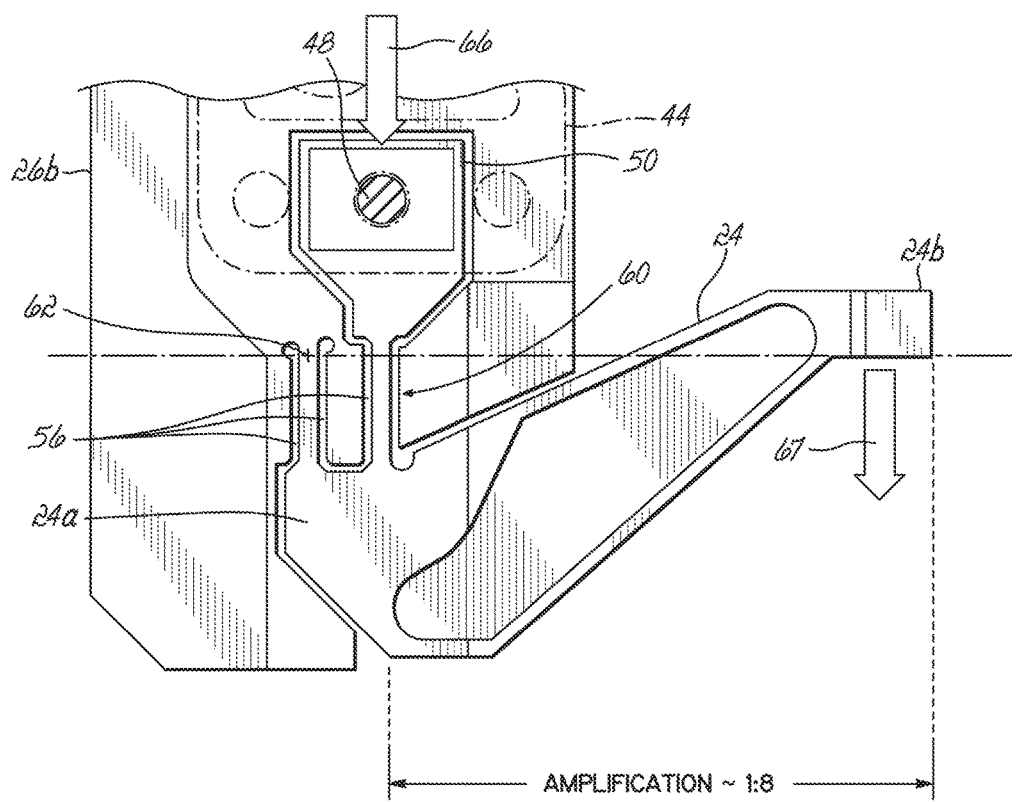
FIG. 5 is a side elevational view of a lower portion of the actuator illustrating a lever amplification mechanism.

The operation of the system 10 to jet droplets or small amounts of fluid will be best understood by reviewing FIGS. 2-4 in conjunction with FIGS. 2A and 2B. FIG. 2A illustrates the tappet or valve element 76 raised to an open condition when the voltage to the piezoelectric stack 40 has been sufficiently removed. This causes the stack 40 to contract. As the stack 40 contracts, the flat springs 42, 44 pull the armature 50 upward and this raises the second end 24b of the lever 24, and also raises the push rod 68. Thus, the coil spring 78 of the tappet or valve assembly 22 can then push upward on the upper head portion 76a of the tappet or valve element 76 and raise a distal end 76b of the tappet or valve element 76 off a valve seat 100 affixed to the fluid body 16. In this position, the fluid bore 88 and the area beneath the distal end 76b of the tappet or valve element 76 fills with additional fluid to "charge" the jetting dispenser 12 and prepare the jetting dispenser 12 for the next jetting cycle.

When the piezoelectric stack 40 is activated, i.e., when voltage is applied to the piezoelectric stack 40 by the main electronic control 14 (FIG. 1), the stack 40 expands and pushes against the mechanical armature 50. This rotates the lever 24 clockwise and moves the second end 24b downward, also moving the push rod 68 downward. The lower head portion 68a of the push rod 68 pushes down on the upper head portion 76a of the tappet or valve element 76 as shown in FIG. 2B and the tappet or valve element 76 moves quickly downward against the force of the coil spring 78 until the distal end 76b engages against the valve seat 100. In the process of movement, the distal end 76b of the tappet or valve element 76 forces a droplet 102 of fluid from a discharge outlet 104. Voltage is then removed from the piezoelectric stack 40 and this reverses the movements of each of these components to raise the tappet or valve element 76 for the next jetting cycle.

It will be appreciated that the piezoelectric actuator 26 may be utilized in reverse to jet droplets. In this case, the various mechanical actuation structure including the lever 24 or other type of mechanical amplifier would be designed differently such that when the voltage is removed from the piezoelectric stack 40, the resulting contraction of the stack 40 will cause movement of the tappet or valve element 76 toward the valve seat 100 and the discharge outlet 104 to discharge a droplet 102 of fluid. Then, upon application of the voltage to the stack 40, the amplification system and other actuation components would raise the tappet or valve element 76 in order to charge the fluid bore 88 with additional fluid for the next jetting operation. In this embodiment, the tappet or valve element 76 would be normally closed, that is, it would be engaging the valve seat 100 when there is no voltage applied to the piezoelectric stack 40.

As further shown in FIG. 2, the upper actuator portion 26a is separate from the lower actuator portion 26b and these respective portions 26a, 26b are formed from different materials. Specifically, the upper actuator portion 26a is formed from a material having a lower coefficient of thermal expansion than the material forming the lower actuator portion 26b. Each of the actuator portions 26a, 26b is securely fastened together using threaded fasteners (not shown) extending from the lower actuator portion 26b into the upper actuator portion 26a. The assembly of the upper and lower actuator portions 26a, 26b is then fastened to the housing by a plurality of bolts 110. More specifically, the lower actuator portion 26b may be formed from PH17-4 stainless steel, while the upper actuator portion 26a may be formed from a nickel-iron alloy, such as Invar. 17-4 PH stainless steel has a very high endurance limit, or fatigue strength, which increases the life of flexural portion 60. The coefficient of thermal expansion of this stainless steel is about 10 μm/m-C, while the coefficient of thermal expansion of Invar is about 1 μm/m-C. The ratio of the thermal expansions may be higher or lower than the approximate 10:1 ratio of these materials. The coefficients of thermal expansion associated with the upper and lower actuator portions 26a, 26b effectively provide offsetting characteristics to each other. The differing coefficients of thermal expansion of the upper and lower actuator portions 26a, 26b thereby allow the actuator 26 to operate consistently across a wider temperature range. Also, piezo stacks, when operated at a high duty cycle, can generate significant heat. Use of Invar provides for more absolute positioning of the end of the actuator 26, and hence more accurate and useable stroke.

Figure 6:
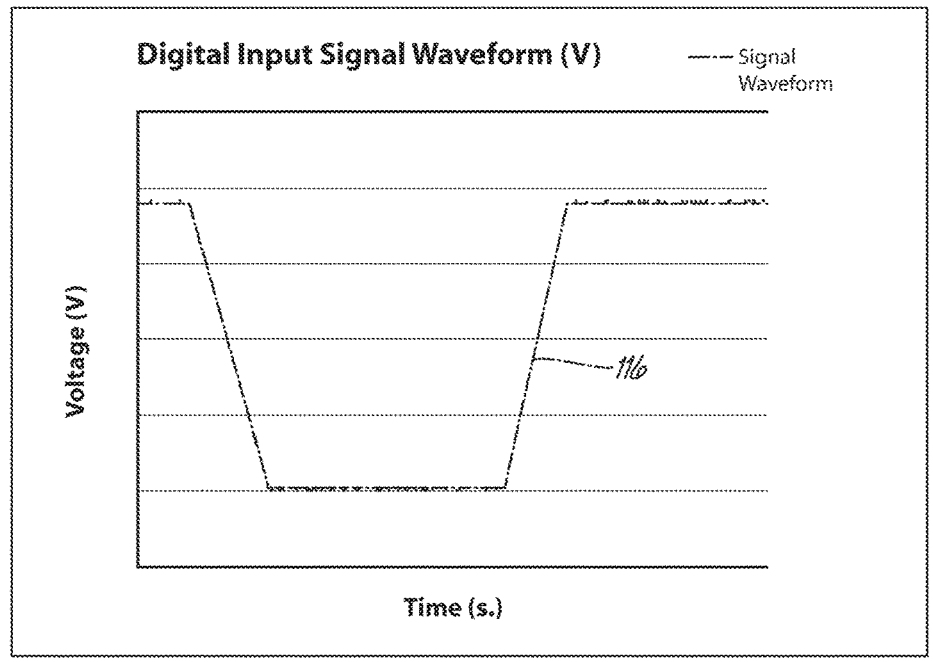
FIG. 6 is a graphical illustration showing a typical signal output having a trapezoidal waveform.
Figure 7:
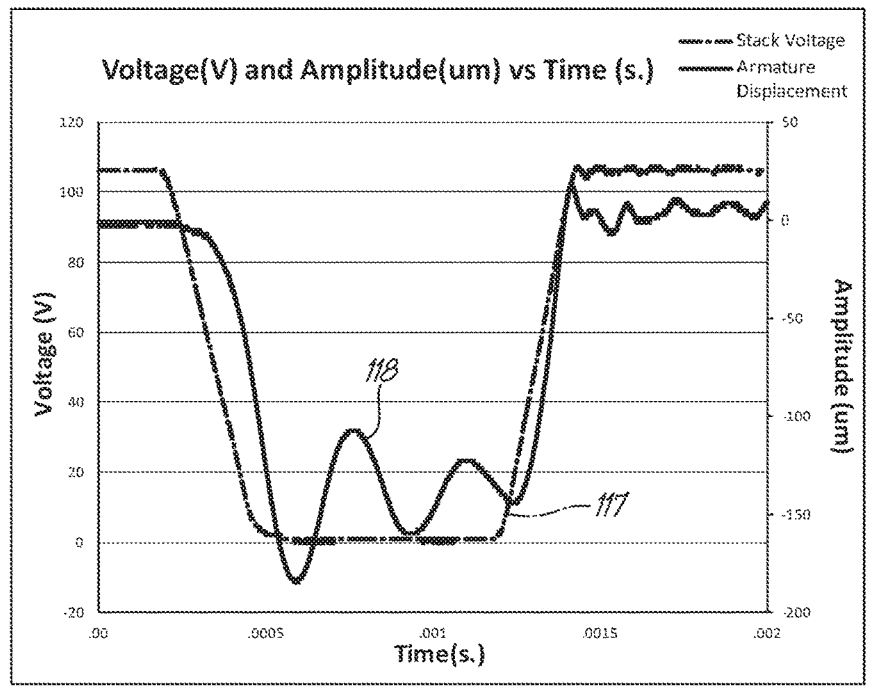
FIG. 7 is a graphical illustration overlaying the typical trapezoidal waveform of FIG. 6 with the resulting, oscillating movement of the mechanical output associated with a piezoelectric jetting dispenser.

Referring now to FIGS. 6 and 7, FIG. 6 illustrates a digital signal 116 generated by the main control 14 (FIG. 1) for directing a single dispense cycle, and without application of the principles of the present invention. In this example, the digital signal voltage is dropped abruptly and at a constant rate to 0 volts and held there for a very short period of time. After that short period of time, the signal voltage is then raised at a constant rate to the level used to activate the piezoelectric stack. As previously explained, the application of voltage will lengthen the piezoelectric stack and may be used to close the valve element during a jet dispensing operation. The resulting analog voltage waveform is shown by the dashed line 117 in FIG. 7. The movement of the mechanical actuation components in response to the abrupt removal and reapplication of voltage is shown by the solid line 118 in FIG. 7. Because the piezoelectric actuator moves much more quickly than the mechanical components coupled to it, such as a mechanical armature, amplifier, and jetting valve, the result is that these mechanical components will oscillate back and forth after the removal of voltage as shown by the oscillating solid line 118 in FIG. 7. This oscillation has negative effects such as those discussed in the Background section above.

Figure 8:
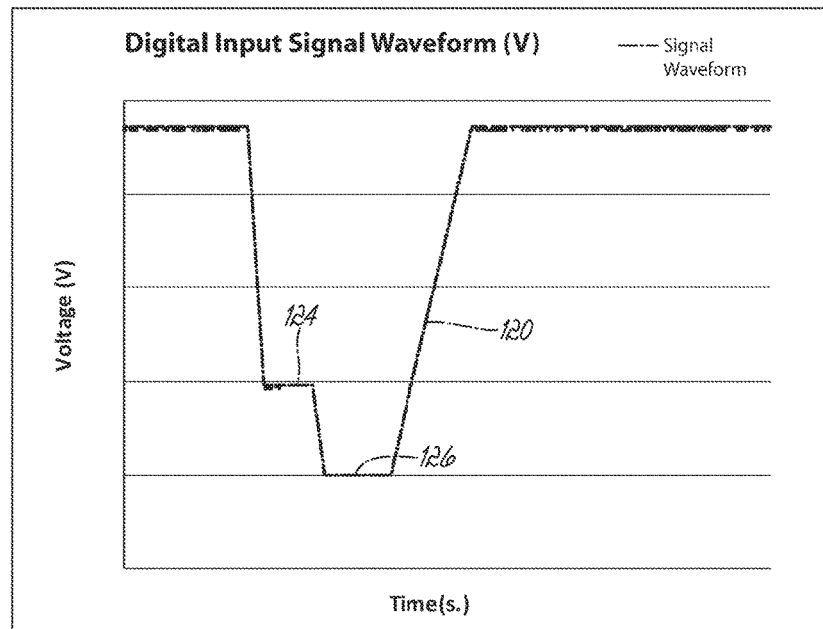
FIG. 8 is a graphical illustration showing a stepped reduction in the input signal voltage in accordance with an illustrative embodiment of the invention.
Figure 9:
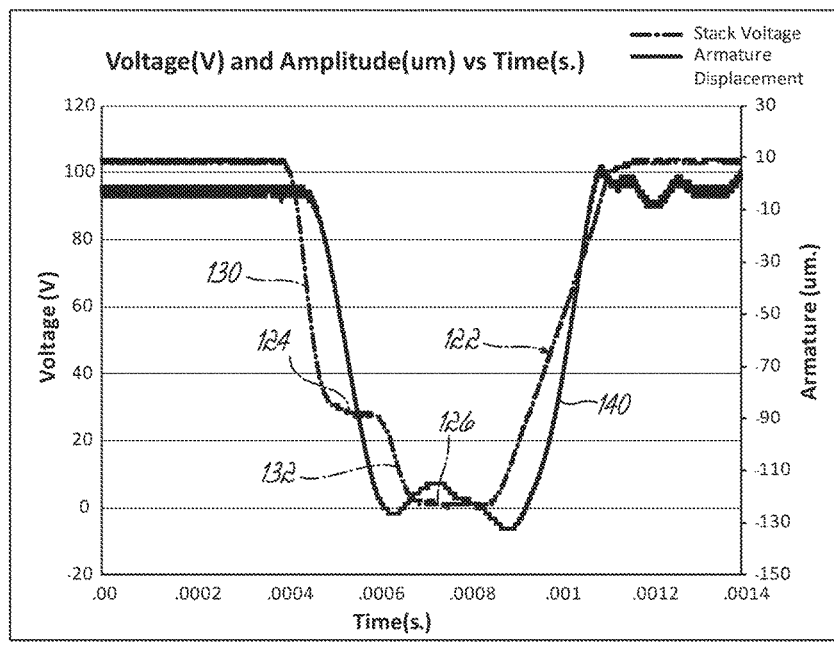
FIG. 9 is a graphical illustration of the stepped reduction in actual voltage corresponding to in FIG. 8, but overlaid with a graphical illustration of the resulting movement of the mechanical output of the piezoelectric jetting dispenser.

FIGS. 8 and 9 illustrate waveforms 120, 122 of the digital input signal voltage (FIG. 8), and the resulting analog voltage applied to and removed from the piezoelectric stack (FIG. 9). More specifically, in this embodiment the input signal voltage waveform 120 and the resulting input analog voltage waveform 122 show that the voltage to the stack 40 (FIG. 4) is removed at a varying or discontinuous rate. More generally, the electronic controller applies a voltage in a waveform having a varying rate of change. In this example, the voltage is removed from the piezoelectric stack in a stepped manner including a first reduction in voltage whereupon the voltage is reduced and then maintained at a first voltage level 124 for a period of time. Then the voltage is reduced to a second voltage level lower than the first voltage level 124 and maintained at the second voltage level 126 for a period of time. The second voltage level 126, in this example, is 0 volts. However, it will be understood that the varying rate of change in voltage may include more than one step in the reduction, or may include other manners of effecting a varying rate of change when removing the voltage. Moreover, for additional control, the rate of voltage reduction may vary between the steps. That is, the voltage reduction represented by a first portion 130 of the waveform is at a different rate of reduction than the voltage reduction represented by a second portion 132 of the waveform.

The solid line 140 in FIG. 9 illustrates the resulting reduction or damping of oscillation in the mechanical components, including the lever 24, push rod 68 and tappet or valve element 76 as shown by the reduced amplitude of oscillation (see FIG. 2). During the first reduction in voltage to level 124, the armature 50 begins moving upwardly as the piezoelectric stack 40 (FIG. 4) contracts. Holding this voltage at the first step or level 124 allows the armature 50 to more slowly build momentum toward its final upper position. After a short period of time, the voltage is further reduced to its final value of zero at the second level 126 and held there for a short time. By the time the voltage is further reduced to this second level 126, the momentum of the armature 50 should at least be significantly reduced, such that it will not be accelerating into its final position. It is this acceleration that causes oscillation as the armature 50 rebounds from its final position. The piezoelectric stack 40 and other mechanical components, including those coupled with the armature 50, are designed such that the armature 50 should stop without significant oscillation at its final upper position. Another advantage of the stepped waveform 122, or other manners of varying the rate of change in voltage, is that the dispense cycle rate can be increased or quickened, because there is less oscillation between dispense cycles.

Figure 10:
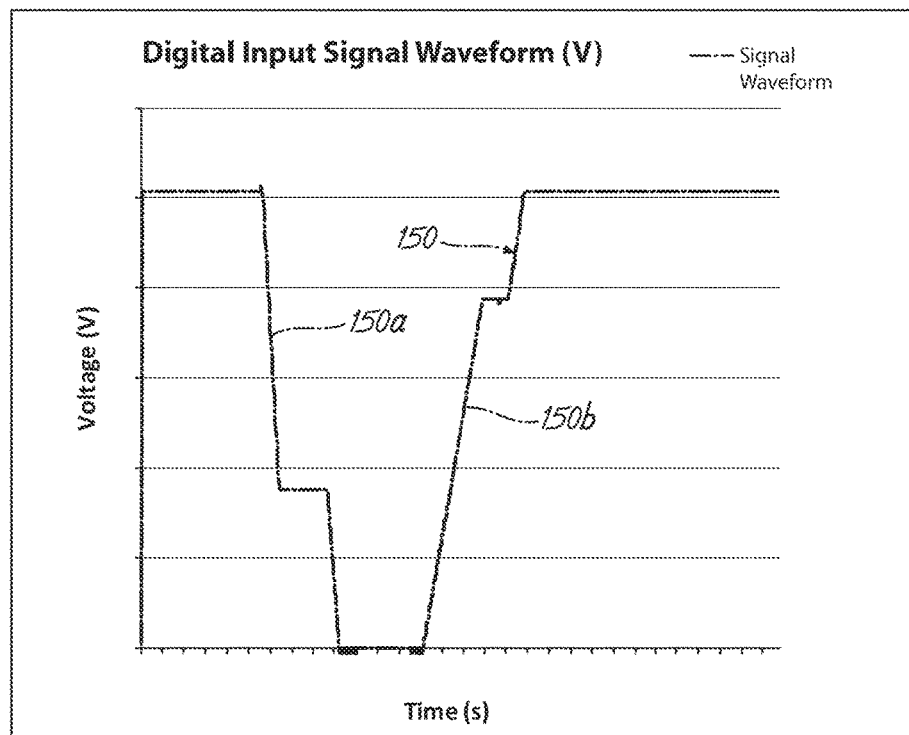
FIG. 10 is a graphical illustration of another alternative embodiment showing both a stepped reduction in the input signal voltage, and a stepped application of the signal voltage during a jetting dispensing cycle.
Figure 11:
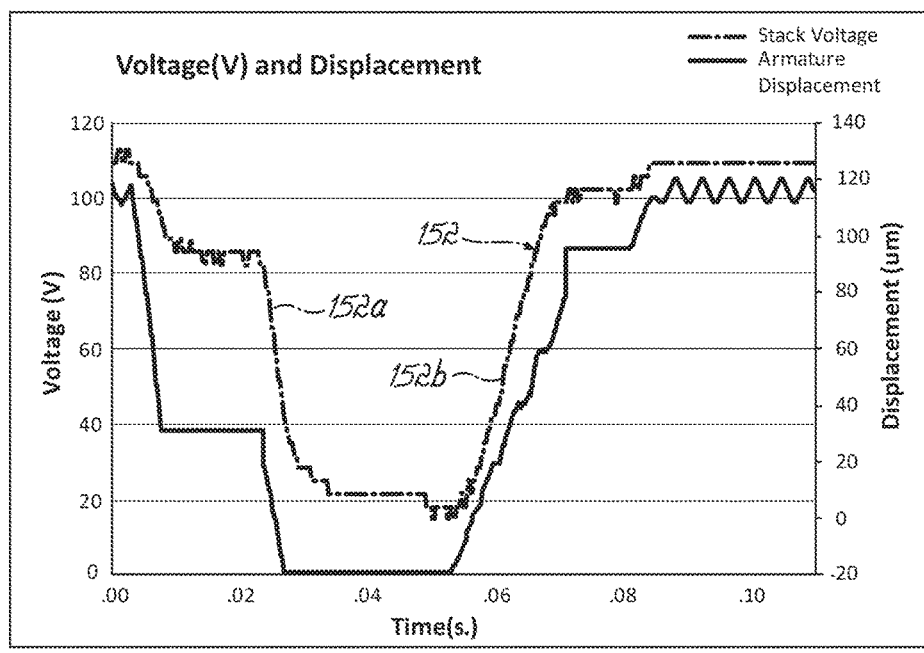
FIG. 11 is a graphical illustration of the stepped reduction and application in actual voltage corresponding to FIG. 10, but overlaid with a graphical illustration of the resulting movement of the mechanical output of the piezoelectric jetting dispenser.

FIGS. 10 and 11 are similar to FIGS. 8 and 9, except that the stepped waveform is not only used when removing the voltage as discussed with regard to FIGS. 8 and 9, and shown by the first halves 150a, 152a of the waveforms 150, 152 in FIGS. 10 and 11, but is also used when re-applying the voltage (e.g., at a third voltage level) as shown by the second halves 150b, 152b of the waveforms 150, 152 in FIGS. 10 and 11. Again, this stepped reapplication of voltage may be substituted with another manner of varying the rate of change in voltage as the voltage is reapplied to the piezoelectric stack, in this example, to close the jetting tappet or valve element 76 and dispense a small amount or droplet of fluid as shown in FIG. 2B. Also, different waveform portions may have different rates of change in the voltage, for purposes of allowing further control of the valve element closure and jetting process. The use of a stepped application of voltage while moving the jetting tappet or valve element 76 toward the valve seat 100 (FIG. 2B) has several possible advantages. For example, the force at which the tappet or valve element 76 impacts the valve seat 100 may be better controlled (e.g., reduced in order to promote longer valve seat life). The amount of energy transferred to the fluid by the tappet or valve element 76 may also be controlled by varying the rate of change in voltage used for jetting the fluid. This aspect may be used to control jetting performance. Also, oscillation of the tappet or valve element 76 during its movement toward the valve seat 100 may be damped and result in higher quality dispense operation and more accurate dispensed fluid volume control. It will also be understood that for certain applications, the rate of change in voltage (either removing voltage or applying voltage) to the piezoelectric actuator 26 may occur: 1) only while raising the jetting tappet or valve element 76 from the valve seat 100 as discussed with regard to FIGS. 8 and 9; 2) both while raising and lowering the jetting tappet or valve element 76 as discussed with regard to FIGS. 10 and 11; or 3) only while moving the jetting valve element toward the outlet during a jetting dispense operation.

While the present invention has been illustrated by the description of specific embodiments thereof, and while the embodiments have been described in considerable detail, it is not intended to restrict or in any way limit the scope of the appended claims to such detail. The various features discussed herein may be used alone or in any combination. Additional advantages and modifications will readily appear to those skilled in the art. The invention in its broader aspects is therefore not limited to the specific details, representative apparatus and methods and illustrative examples shown and described. Accordingly, departures may be made from such details without departing from the scope or spirit of the general inventive concept.

What is claimed is:

1. A method for jetting a fluid from a jetting dispenser including a piezoelectric actuator operatively coupled, via a mechanical amplifier, to a movable shaft and a fluid body with an outlet orifice, the method comprising:
applying, via an electronic controller, a voltage with a varying rate of change to the piezoelectric actuator;
moving the piezoelectric actuator under the applied voltage with the varying rate of change to move, via the mechanical amplifier, the movable shaft with reduced oscillation amplitude of the movable shaft during movement toward and/or away from the outlet orifice; and
jetting an amount of the fluid from said outlet orifice using the movable shaft.

2. The method of claim 1, wherein applying the voltage comprises applying a stepped waveform to the piezoelectric actuator including a first voltage and a second voltage, the second voltage being different than the first voltage.

3. The method of claim 2, wherein said second voltage is lower than said first voltage.

4. The method of claim 3, wherein said second voltage is 0 volts.

5. The method of claim 3, wherein said stepped waveform further includes a third voltage, said third voltage being greater than said second voltage and following said second voltage in said stepped waveform.

6. The method of claim 2, wherein applying the stepped waveform to the piezoelectric actuator comprises reducing the voltage applied to the piezoelectric actuator in a stepped manner by reducing the voltage to the first voltage and then applying the second voltage that is lower than the first voltage.

7. The method of claim 1, wherein applying the voltage comprises applying the voltage with a decreasing rate of change.

8. The method of claim 1, wherein applying the voltage comprises applying the voltage with an increasing rate of change.

* * * * *